United States Patent [19]

Akagiri

[11] Patent Number: 4,471,318
[45] Date of Patent: Sep. 11, 1984

[54] CIRCUIT FOR NOISE REDUCTION PARTICULARLY USEFUL WITH SIGNAL RECORDING/REPRODUCING APPARATUS

[75] Inventor: Kenzo Akagiri, Yokohama, Japan

[73] Assignee: Sony Corporation, Tokyo, Japan

[21] Appl. No.: 226,821

[22] Filed: Jan. 21, 1981

[30] Foreign Application Priority Data

Jan. 28, 1980 [JP] Japan ................................. 55-8592

[51] Int. Cl.³ .......................... H03F 1/26; H03G 7/06
[52] U.S. Cl. .................................. 330/149; 330/126; 330/284; 333/14
[58] Field of Search ............... 330/86, 126, 149, 285, 330/278, 302; 333/14

[56] References Cited

U.S. PATENT DOCUMENTS

| 3,846,719 | 11/1974 | Dolby | 333/14 |
| 3,902,131 | 8/1975 | Dorren | 330/126 |
| 4,281,295 | 7/1981 | Nishimura et al. | 330/126 |
| 4,327,331 | 4/1982 | Yoshimi et al. | 330/126 |

FOREIGN PATENT DOCUMENTS

| 2211348 | 3/1972 | Fed. Rep. of Germany . |
| 2216498 | 4/1972 | Fed. Rep. of Germany . |
| 953135 | 9/1961 | United Kingdom . |
| 1044003 | 6/1962 | United Kingdom . |
| 1305622 | 7/1969 | United Kingdom . |
| 1425172 | 4/1972 | United Kingdom . |
| 1438711 | 1/1973 | United Kingdom . |
| 1473833 | 5/1973 | United Kingdom . |
| 1500192 | 1/1975 | United Kingdom . |

Primary Examiner—James B. Mullins
Assistant Examiner—Gene Wan
Attorney, Agent, or Firm—Lewis H. Eslinger; Alvin Sinderbrand

[57] ABSTRACT

A circuit for noise reduction is disclosed, including a first signal path connected to receive an input signal and including a high pass filter for providing substantial de-emphasis of the lower frequency components of the input signal relative to the higher frequency components thereof and a variable gain amplifier for amplifying the output of the high pass filter with controllable gain. A second signal path is connected to receive the input signal and provides little or no de-emphasis of the higher frequency components relative to the lower frequency components of the input signal. The outputs of the first and second signal paths are summed to produce a noise-reduced output signal. The gain of the variable gain amplifier is controlled so as to exhibit higher gain when the input signal level is relatively low and to exhibit lower gain when the input signal level is relatively high. This circuit can be used for level-compression, as in a noise-reducing encodier for a signal recorder, and may be used for signal expansion as in a noise-reducing decoder for a signal reproducer.

19 Claims, 11 Drawing Figures

CIRCUIT FOR NOISE REDUCTION PARTICULARLY USEFUL WITH SIGNAL RECORDING/REPRODUCING APPARATUS

BACKGROUND OF THE INVENTION

This invention relates to a circuit for noise reduction and, more particularly, to a circuit which can be used as a level-compressing encoder for signals which are to be recorded, and which can be used as a level-expanding decoder for signals which are reproduced from a record medium.

Noise reduction circuits are used in signal transfer systems, such as in signal recorders and the like, in order to reduce noise and distortion which would be accentuated by that system, whereby the effect of the noise reduction circuit is to expand the apparent dynamic range of that system. In a typical noise reduction circuit, an encoder is provided for those signals which are to be recorded, and a complementary decoder is provided for those signals which are reproduced. The encoder generally includes a level-compression circuit and a high frequency pre-emphasis circuit, wherein higher frequency components of an information signal to be recorded are emphasized, the emphasis level being inversely related to the information signal level. The decoder generally includes a level-expansion circuit and a high frequency de-emphasis circuit to perform a complementary operation on the information signals which are reproduced.

In the Dolby ® noise reduction system, a low-level input signal is amplified with a substantially constant gain until that input signal reaches a predetermined level. Thereafter, the amplification of that input signal is reduced until yet another, higher level is reached, whereupon amplification with substantially constant gain is carried out once again. In addition to such amplification of the input signal prior to recording, an emphasis circuit is used in order to pre-emphasize the higher frequency components of the input signal. This overall operation generally is referred to as signal compression. After the input signal has been suitably compressed, it is recorded. A complementary signal expansion process is carried out when the aforementioned signal is reproduced. That is, the pre-emphasized high frequency components are de-emphasized, and the de-emphasized signal is amplified with a gain less than unity. This gain is substantially constant over a predetermined range of relatively low signal levels, and when the reproduced signal exceeds a predetermined level, the gain is increased until a still higher level is reached.

The aforementioned Dolby noise reduction system is of relatively simple construction; and this system has been used extensively in home entertainment systems, such as magnetic tape recorders/reproducers and the like. However, although the Dolby system results in some improvement in the dynamic range of the recorder/reproducer, this improvement generally is limited to be on the order of about 10 dB; and this improvement is apparent primarily in the frequency region which exceeds 1 KHz. Furthermore, the aforementioned changes in the gain of the level-compression and level-expansion amplifiers are non-linear. Because of this non-linearity in the gains, level matching between the encoding and decoding processes often is difficult. Hence, some distortion may be apparent for those signals having intermediate signal levels.

Another noise reduction system is the so-called DBX ® system. This system is described in U.S. Pat. No. 3,789,143. One advantage of the DBX system over the aforementioned Dolby system is that the gains of the amplifiers which carry out the signal compression and signal expansion operations, that is, the signal expansion and signal compression ratios, are substantially constant, regardless of the signal level of the input information signal. For example, prior to the recording operation, the input information signal is compressed with a constant compression ratio k. When the compressed signal subsequently is reproduced, the reproduced signal is expanded with a constant ratio 1/k, that is, at an expansion ratio which is the reciprocal of the compression ratio. Since constant compression and expansion ratios are used throughout the signal level range, that is, the non-linearity found in the Dolby system is avoided, level matching between recorded and reproduced signals is easily attained. Moreover, in the DBX system, the apparent improvement in the dynamic range of the recorder/reproducer is on the order of about 40 dB. Also, desirable noise reduction is achieved over substantially the entire audio frequency range of 20 Hz to 20 KHz.

However, the particular compression and expansion characteristics of the aforementioned noise reduction systems generally are obtained primarily for constant input signal levels, that is, signal levels which do not undergo abrupt transients. Stated otherwise, the advantages attained by these noise reduction systems are a function primarily of the static characteristics thereof. Difficulties are found in the dynamic transient characteristics of such systems. For example, if an information signal to be recorded exhibits a relatively low signal level, the gain, or compression ratio, of the encoder amplifier may be relatively high. Now, if this information signal undergoes an abrupt increase in its signal level, that is, it undergoes a large positive transient, the gain of the amplifier, or compression ratio, will not be reduced as rapidly as the signal level increases. Hence, although the gain, or compression ratio, should be reduced when processing the high-level information signal, in actuality it remains at its prior high level. Consequently, the strong transient is amplified with relatively large gain, thereby resulting in a compressed signal that exhibits "overshoot". That is, the level of the compressed signal is far too large. This high-level signal, when recorded, results in saturation of the magnetic medium, thereby causing distortion in the signal which is recorded and in the information which ultimately is reproduced therefrom.

Another disadvantage of the aforementioned noise reduction systems is that they may be subject to so-called noise modulation. In noise modulation, noise components are varied as a function of input signal level variations. Such changes in the noise components, or noise modulation, is highly perceptible and is quite distracting when it accompanies a reproduced audio signal. This phenomenon is pronounced when the frequency components of the input signal are noticeably different from the noise frequency component. For example, if the information signal is an audio signal representing the sound of a piano, noise modulation is heard separately and distinctly, and is not masked even if the volume level of the information signal is increased.

One proposal for reducing noise modulation in a noise reduction circuit is described in U.S. Pat. No.

4,162,462. In this proposal, the higher frequency components of the information signal are pre-emphasized prior to recording when the information signal exhibits low and medium signal levels, and relatively little pre-emphasis is provided when the information signal exhibits higher levels. When the information signal processed in the foregoing manner is reproduced, the higher frequency components are subjected to relatively high de-emphasis when the reproduced signal exhibits low and medium signal levels, and these higher frequency components are subjected to relatively low de-emphasis when the reproduced signal is at a higher level. Although this proposal reduces the undesired effects of noise modulation, saturation of the magnetic record medium due to overshoot in the compressed signal nevertheless is present.

In order to overcome the aforenoted disadvantage presented by overshoot, it also has been proposed to increase the speed of response of the level-compression circuitry. However, if the response speed is increased, an improvement in eliminating overshoot is accompanied by deterioration in the noise modulation characteristic. Another proposal in preventing overshoot is described in copending application Ser. No. 151,154, filed May 19, 1980. As will be apparent from the ensuing description, the present invention is an improvement over the noise reduction circuit described in this copending application.

Another proposal of a noise reduction circuit which minimizes overshoot contemplates the use of a plurality of substantially similar noise reduction circuits connected in parallel. Each noise reduction circuit is intended to operate over a selected portion of the frequency spectrum of the input information signal. The outputs of these individual noise reduction circuits are combined, or mixed, resulting in an overall level-compressed information signal suitable for recording. However, the use of a plurality of parallel-connected noise reduction circuits is relatively complex and expensive. For example, if n such noise reduction circuits are used, the overall cost of the noise reduction system is n times the cost of a noise reduction system in which only a single noise reduction circuit is used.

OBJECTS OF THE INVENTION

Therefore, it is an object of the present invention to provide an improved circuit for noise reduction that avoids the aforenoted disadvantages and difficulties, is relatively simple in construction and inexpensive.

Another object of this invention is to provide a circuit for noise reduction that can be used in an information recording/reproducing system.

A further object of this invention is to provide a circuit for noise reduction that can be used in an encoder to level-compress an information signal prior to the recording thereof, and this circuit also can be used in a decoder to level-expand the reproduced signal, thereby expanding the apparent dynamic range of the recording/reproducing system by a factor on the order of about 20 to 30 dB.

An additional object of this invention is to provide a circuit for noise reduction which produces variable pre-emphasis and de-emphasis without any external manual adjustment thereof.

Yet another object of this invention is to provide a level-compression circuit for noise reduction, which circuit can be used with a limiter without adversely affecting circuit operation, thereby preventing transient saturation of the magnetic recording medium due to overshoot.

A still further object of this invention is to provide a level compression circuit whose transfer characteristic is more frequency-sensitive for lower level input signals than for higher level input signals, thereby providing greater pre-emphasis for input signals having relatively low levels.

Another object of this invention is to provide an improved level expansion circuit whose transfer characteristic is more frequency-sensitive for lower level input signals than for higher level input signals, such that greater de-emphasis is obtained for relatively low level signals which are reproduced from a record medium.

Still another object of this invention is to provide an improved compression/expansion circuit which can be switchably connected so as to provide a level compression function when used with a signal recorder and to provide a level-expansion function when used with a signal reproducer.

Various other objects, advantages and features of the present invention will become readily apparent from the ensuing detailed description, and the novel features will be particularly pointed out in the appended claims.

SUMMARY OF THE INVENTION

In accordance with this invention, a circuit is provided for noise reduction. A first signal path is connected to receive an input signal and is provided with a high pass filter for providing substantial de-emphasis of the lower frequency components relative to the higher frequency components of the input signal, and also is provided with a variable gain amplifier for amplifying the output of the high pass filter with controllable gain. A second signal path is connected to receive the input signal and to provide relatively minor or substantially no de-emphasis of the higher frequency components relative to the lower frequency components. The outputs of the signal paths are summed to produce an output signal. When used as a level-compression circuit, this output signal is a level-compressed signal. When used as a level-expansion circuit, this output signal is a level-expanded signal. The gain of the variable gain amplifier is controlled so as to exhibit higher gain when the input signal level is relatively low and to exhibit lower gain when the input signal is relatively high.

In one embodiment, the first signal path also is provided with a limiter for limiting transient overshoot in the amplified signal in the event of a sudden increase in the input signal level.

BRIEF DESCRIPTION OF THE DRAWINGS

The following detailed description, given by way of example, will best be understood in conjunction with the accompanying drawings in which.

DETAILED DESCRIPTION OF PREFERRED EMBODIMENTS

Figure 1:
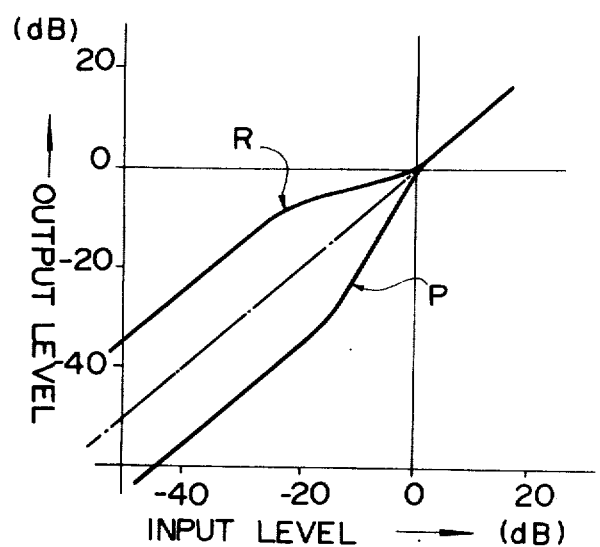
FIGS. 1 and 2 are graphical representations of the compression/expansion characteristics of two prior art noise reduction circuits.

Referring now to the drawings, wherein like reference numerals are used throughout, FIG. 1 is a graphical representation of the compression/expansion characteristics of the aforementioned Dolby noise reduction system. Curve R represents the level-compression characteristic wherein the input and output signal levels are in terms of decibels. Curve P represents the level-expansion characteristic. It is seen that, for input signals of relatively lower levels, substantially uniform gain is provided until an intermediate level is reached, whereupon the linearity of the level-compression characteristic no longer obtains. It is this non-linear feature which makes level-matching difficult. The dot-dash curve in FIG. 1 represents the so-called "flat bass" wherein input and output signal levels are constant both for level-compression and level-expansion.

Figure 2:
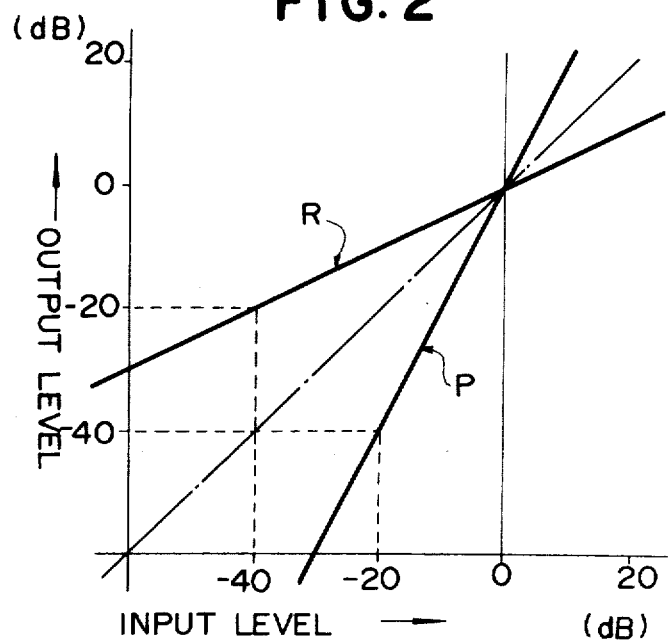

FIG. 2 is a graphical representation of the level-compression characteristic R and the level-expansion characteristic P of the aforementioned DBX noise reduction system. It is appreciated that, in this DBX system, the compression and expansion ratios are substantially constant throughout the input signal level range. Here too, the dot-dash curve represents the "flat bass" response.

Figure 3:
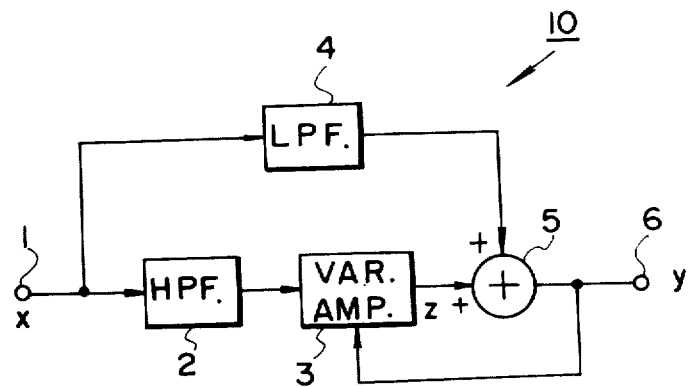
FIG. 3 is a block diagram of a basic embodiment of the present invention.

As mentioned previously, the Dolby and DBX systems suffer from disadvantages which are overcome by the present invention. A basic embodiment of the circuit which is used for noise reduction in accordance with the present invention is illustrated in FIG. 3 as circuit 10 and is comprised of an input terminal 1 to which two signal paths are connected. The first signal path includes a high pass filter 2 and a variable gain amplifier 3 connected in series. The output of variable gain amplifier 3 is coupled to a summing circuit 5, the other input of which is coupled to the second signal path which is provided with a low pass filter 4. The output of summing circuit 5 is connected to an output terminal 6.

High pass filter 2 is adapted to provide substantial de-emphasis of the lower frequency components included in the information signal supplied to input terminal 1. Stated otherwise, high pass filter 2 provides substantial pre-emphasis to the high frequency components of the information signal. For example, the higher frequency components are pre-emphasized relative to the lower frequency components by a factor on the order of about 20 dB. Variable gain amplifier 3 is adapted to amplify the output of high pass filter 2 by a variable gain. As will be described, the gain of amplifier 3 is inversely related to the signal level of the input information signal such that the gain thereof is relatively high when the input signal is relatively low and, conversely, the gain thereof is relatively low when the input signal level is relatively high. In the embodiment shown in FIG. 3, the gain of variable gain amplifier 3 is determined by a gain control signal which is derived from the output of summing circuit 5. It will be appreciated that, alternatively, the gain control signal supplied to variable gain amplifier 3 may be derived from the information signal supplied to input terminal 1. As will be described below, the gain control signal derived from the output of summing circuit 5 may be produced by the combination of a weighting circuit, which exhibits high pass filter characteristics, and a rectifier and smoothing circuit, thereby supplying a lower frequency, or DC gain control signal to the variable gain amplifier. Thus, variable gain amplifier 3 attains level compression of the input signals supplied thereto.

Low pass filter 4 is adapted to provide relatively minor de-emphasis of the higher frequency components, relative to the lower frequency components, included in the information signal supplied to input terminal 1. For example, the higher frequency components may be reduced, or attenuated, relative to the lower frequency components by a factor on the order of about 6 dB. Alternatively, low pass filter 4 may function merely as an attenuator so as to provide uniform de-emphasis for both higher and lower frequency components, thereby obtaining an attenuation of the input information signal on the order of about 3 dB.

It may be seen that summing circuit 5 is supplied with signals from the illustrated first and second signal paths in a proportion relative to each other determined by the gain of variable gain amplifier 3. For lower level input signals, the gain of variable gain amplifier 3 is relatively high, such that the output of summing circuit 5 is determined primarily by the signals supplied thereto by the amplifier. That is, the level of the signals supplied to summing circuit 5 via the first signal path exceed the level of the signals supplied thereto via the second signal path. Hence, the characteristics of circuit 10 are determined primarily by the characteristics of the first signal path for lower level input signals. As the input signal level increases, the dominance of the first signal path over the second signal path in determining the overall characteristics of circuit 10 decreases. At relatively higher input signal levels, since the gain of amplifier 3 is reduced, the level of the signals supplied to the summing circuit 5 via the second signal path exceeds the level of the signals supplied thereto via the first signal path. Since the first signal path provides higher frequency pre-emphasis for low level input signals, circuit 10 exhibits higher pre-emphasis for the higher frequency components at lower input signal levels, which higher frequency pre-emphasis progressively decreases as the input signal level increases until, at higher input signal levels, circuit 10 exhibits substantially uniform de-emphasis over the input signal frequency range, or, at most, relatively minor higher frequency de-emphasis.

Figure 4:
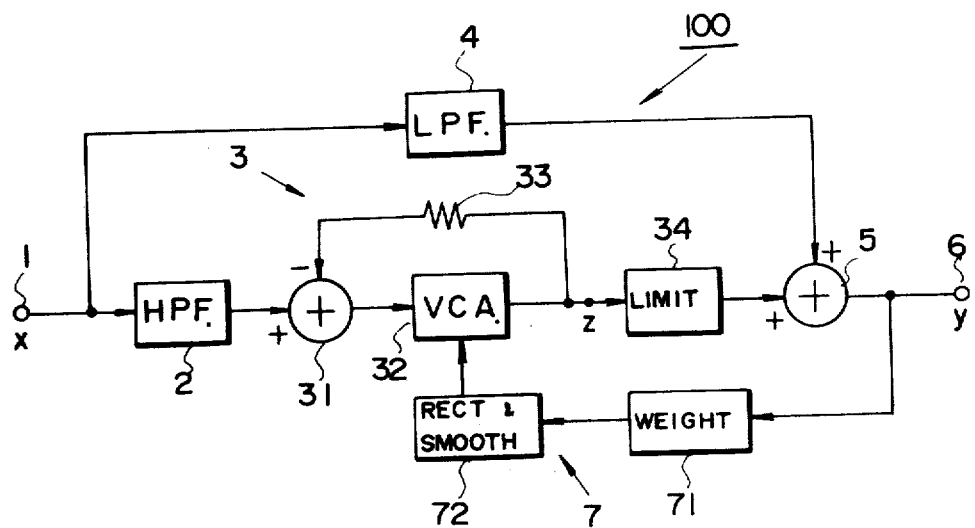
FIG. 4 is a block diagram of a practical embodiment of the present invention.

FIG. 4 illustrates a practical embodiment of noise reduction circuit 100, wherein those elements which are substantially the same as corresponding elements in FIG. 3 are identified by the same reference numerals. Variable gain amplifier 3, illustrated in FIG. 4, is comprised of a voltage controlled amplifier (VCA) 32 whose output is fed back via a feedback resistor 33 and subtracted in a subtracting circuit 31 from the pre-emphasized higher frequency components supplied to the subtracting circuit by high pass filter 2. Resistor 33 thus functions as a negative feedback resistor. If voltage controlled amplifier 32 exhibits negative gain, that is, it functions to invert the signal amplified thereby, then subtracting circuit 31 may comprise an adder in which the inverted, amplified signal is summed with the pre-emphasized output of high pass filter 2, thus effecting a subtracting operation. As before, high pass filter 2 pre-emphasizes the higher frequency components relative to the lower frequency components of the input signal supplied thereto by a factor on the order of about 20 dB.

Voltage controlled amplifier 32 may be saturated if the signal supplied thereto for amplification exceeds a predetermined value. One embodiment of the voltage controlled amplifier is described in greater detail below with respect to the schematic illustration of FIG. 10.

Figure 10:
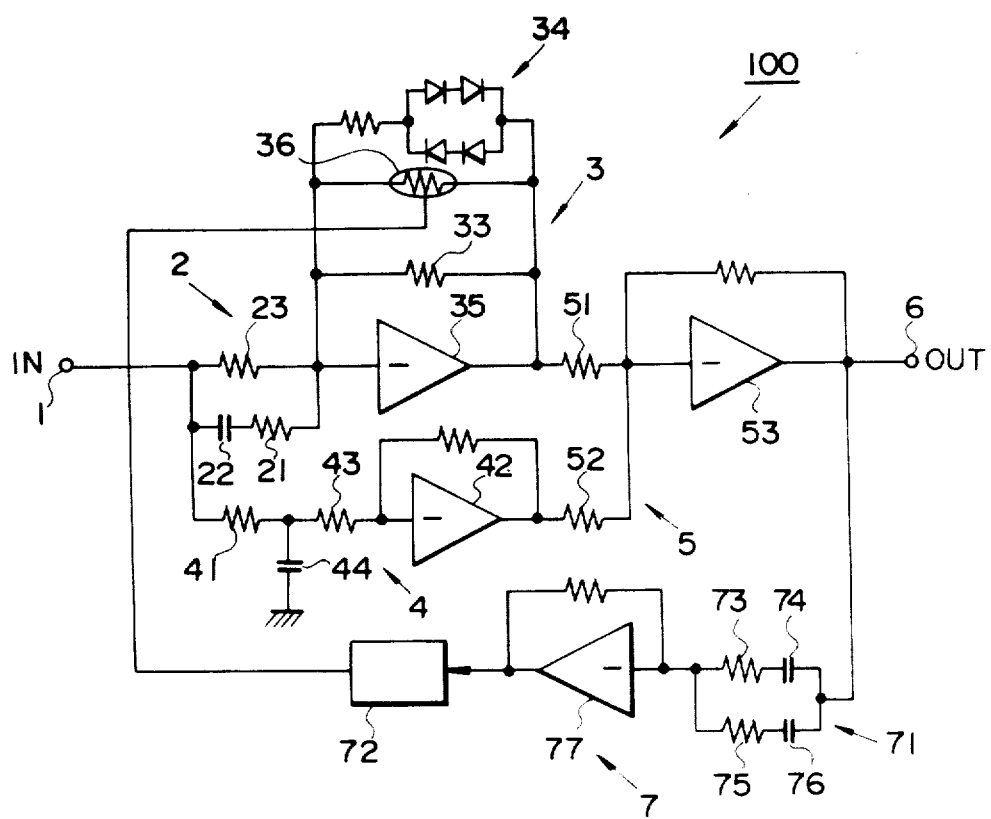
FIG. 10 is a schematic diagram of the embodiment shown in FIG. 4.

The output of voltage controlled amplifier 32 is supplied to summing circuit 5 via a limiting circuit 34. The purpose of the limiting circuit is to prevent, or limit, transient overshoot due to a sudden increase in the level of the signal supplied to voltage controlled amplifier 32. One embodiment of limiting circuit 34 is illustrated in FIG. 10. Alternatively, this limiting circuit may be a diode-limiter type having frequency-responsive characteristics, such as described in copending application Ser. No. 151,154.

As before, low pass filter 4 may be adapted to provide relatively minor de-emphasis to the higher frequency components, relative to the lower frequency components, included in the input signal supplied thereto via input terminal 1. In one embodiment, low pass filter 4 provides de-emphasis, or attenuation, of the lower frequency components of about 3 dB, and de-emphasis of the higher frequency components of about 6 dB. For example, 3 dB de-emphasis is provided for signals whose frequencies are below 1 KHz, and 6 dB de-emphasis is provided for signals whose frequencies exceed 1KHz. Alternatively, low pass filter 4 may comprise a simple attenuator circuit providing uniform 3 dB attenuation over the entire frequency range of the input signal.

Circuit 100 is provided with gain control circuit 7 comprised of weighting circuit 71 coupled to the output of summing circuit 5, and a rectifier and smoothing circuit 72 for rectifying and smoothing the output of the weighting circuit and supplying same to voltage controlled amplifier 32 as a gain control voltage therefor. Weighting circuit 71 exhibits high pass filter characteristics which, in one example, may be substantially similar to the high pass filter characteristics of filter 2. As will be described below with respect to FIG. 10, weighting circuit 71 exhibits a predetermined gain. If the weighting circuit is supplied with, for example, the input information signal directly, the gain thereof should be adjusted to compensate for this change in connection.

Figure 5:
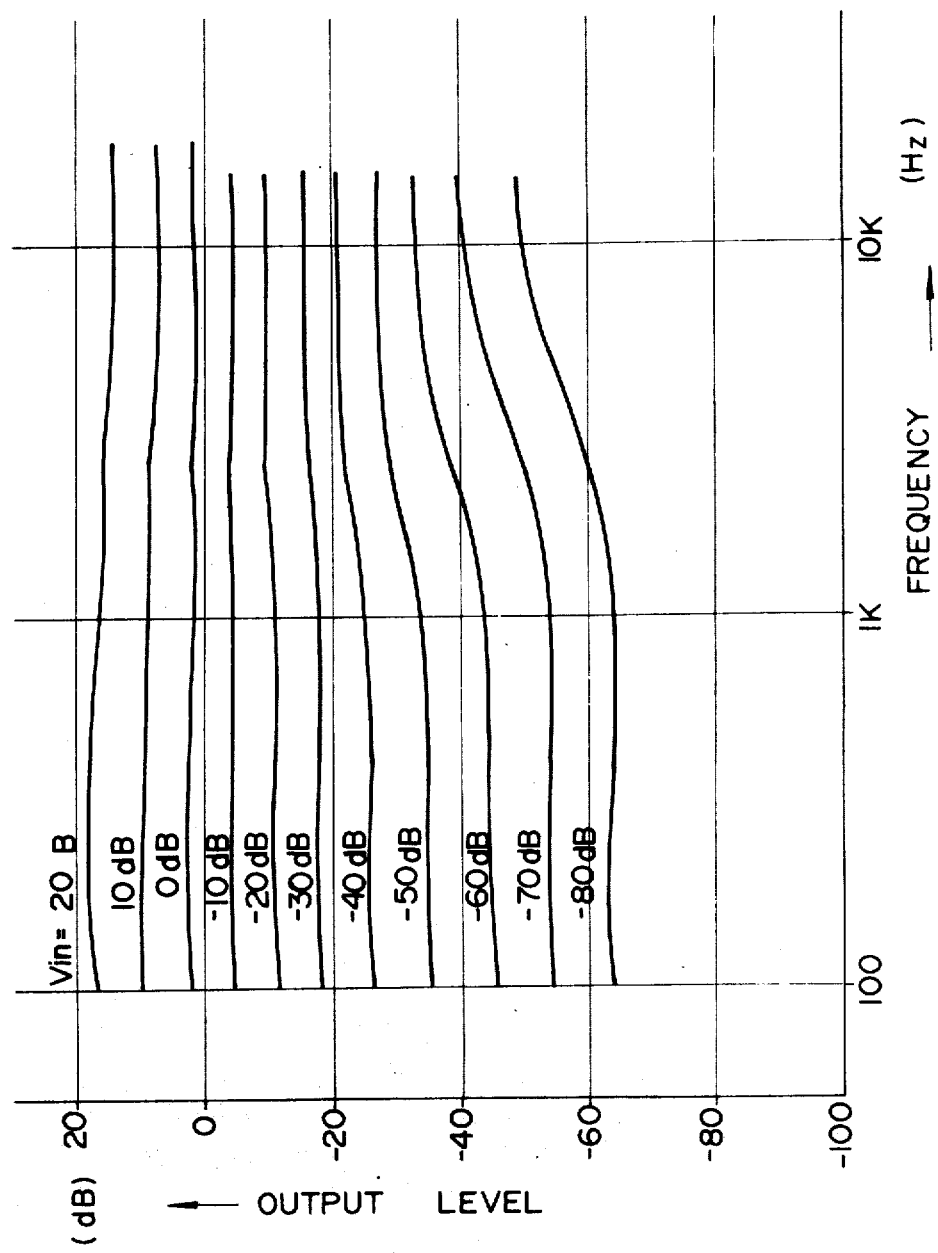
FIG. 5 is a graphical representation of the level-compression characteristics of the embodiment shown in FIG. 5.

FIG. 5 is a graphical representation of the level-compression characteristics of circuit 100. The abscissa in FIG. 5 represents the frequency of the input signal, and the ordinate represents the output signal level at output terminal 6 in terms of decibels. Each curve in FIG. 5 represents a particular input signal level. It is seen that, when the input information signal level is relatively low, the higher frequency pre-emphasis characteristics of the first signal path dominate over the characteristics of the second signal path. For lower frequencies, that is, frequencies less than 1 KHz, the gain of voltage controlled amplifier 32 remains substantially constant. However, as the frequency of this lower level input signal increases, the higher frequency components supplied to voltage controlled amplifier 32 dominate, and summing circuit 5 is supplied with higher frequency components which have been substantially amplified. Thus, for lower level input signals, the level of the output signal produced at output terminal 6 increases as the frequency of the input signal increases. It also is seen that, as the input signal level increases, the gain of voltage controlled amplifier 32 is reduced such that the signal level of the signal supplied to summing circuit 5 via the first signal path no longer is predominant over the signal level of the signal supplied to the summing circuit via the second signal path. Indeed, it is recognized that, as the input signal level increases, the signal level supplied via the second signal path approaches and then exceeds the signal level supplied via the first signal path. Hence, for higher input signal levels, the overall characteristics of circuit 100 approach those of low pass filter 4. The curves of FIG. 5 represent the level-compression operation achieved primarily by the operation of voltage controlled amplifier 32. Of course, in the event of a sudden increase in the input signal level, limiting circuit 34 limits, or prevents, transient overshoot in the output of the amplifier.

As shown in FIG. 5, for higher input signal levels, such as an input signal level on the order of +20 dB, the higher frequency components, that is, those frequencies which exceed 1 KHz, are attenuated to a relatively minor degree relative to the lower frequency components. Input signal levels in the range −80 dB to +20 dB are seen to be compressed to the range from about −75 dB to +15 dB.

Figure 6:
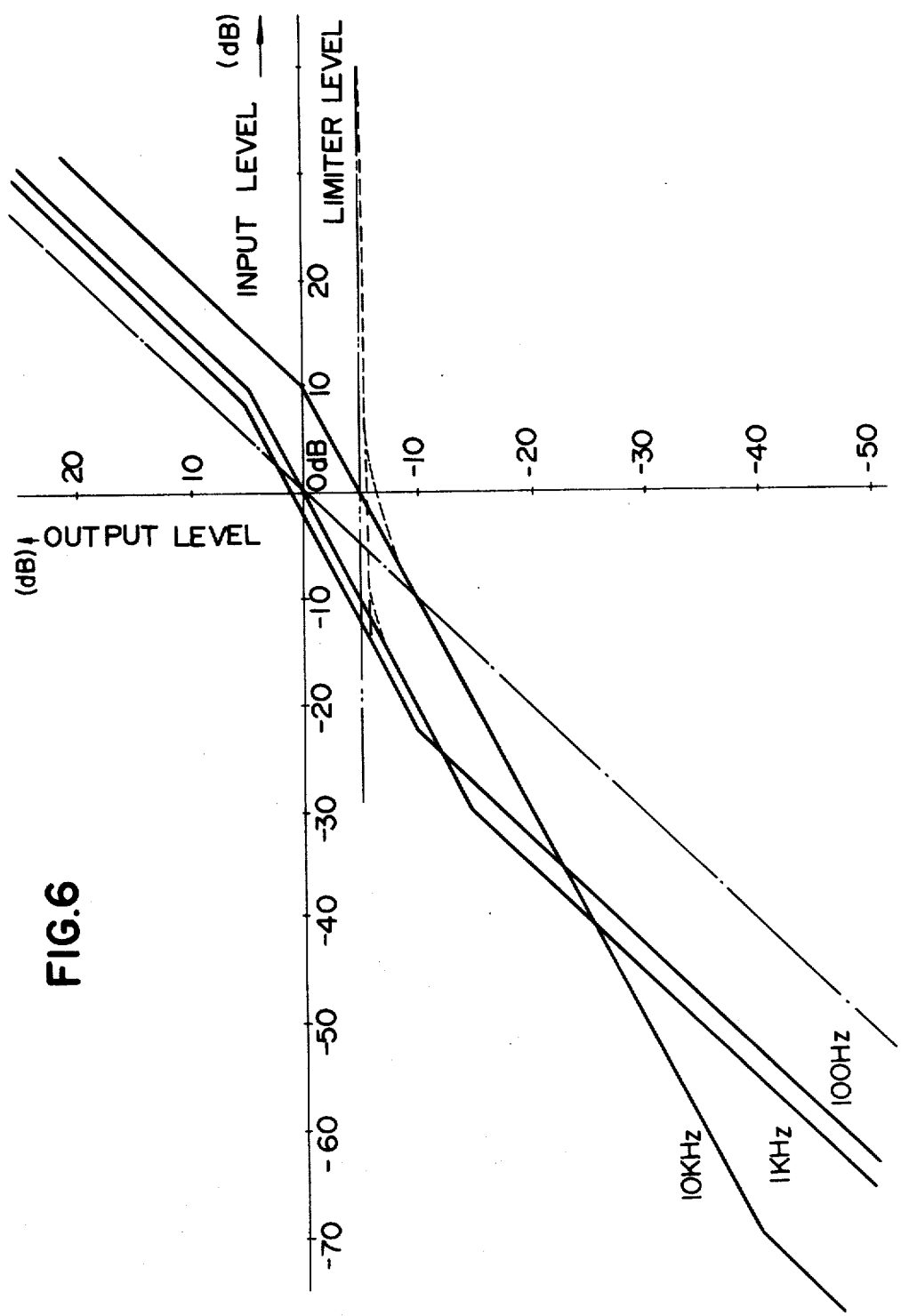
FIG. 6 is a graphical representation of the level-compression characteristics of the FIG. 4 embodiment for particular frequency components.

The level-compression characteristics of circuit 100 for input signals of frequencies 100 Hz, 1 KHz and 10 KHz are illustrated by the respective curves shown in FIG. 6. Level compression is attained over a wider range, and by a greater degree, for higher frequency components (e.g. 10 KHz) than for lower frequency components (e.g. 100 Hz and 1 KHz). The dot-dash line shown in FIG. 6 represents the usual flat bass response.

FIG. 6 also illustrates the limiter level, that is, the limiting level achieved by limiting circuit 34. The broken line superimposed over this limiter level in FIG. 6 represents the prevention of transient overshoot. For example, if the input signal level at 10 KHz exceeds −5 dB, limiting circuit 34 prevents transient overshoot therein, such that the output signal of 10 KHz is limited to a signal level of about −5 dB.

Let it be assumed that the gain G of voltage controlled amplifier 32 is related to a gain control voltage $v_c$ by the constant factor k, as represented by the following expression:

$$G = k/v_c \tag{1}$$

It is seen from equation (1) that gain G is inversely related to the gain control voltage $v_c$ such that this gain is low when the gain control voltage is high and, conversely, this gain is high when the gain control voltage is low. Alternatively, voltage controlled amplifier 32 may exhibit an exponential gain relationship represented by the following expression:

$$G = e^{-k \cdot v_c} \tag{1'}$$

Now, let it be assumed that low pass filter 4 exhibits the transfer function $F_L$ and high pass filter 2 exhibits the transfer function $F_H$. If $g_L$ is the low frequency gain of low pass filter 4, and if $g_H$ is the low frequency gain of high pass filter 2, then these transfer functions may be expressed as:

$$F_L = g_L \cdot \frac{1 + sT_{L2}}{1 + sT_{L1}} \quad (2)$$

$$F_H = g_H \cdot \frac{1 + sT_{H1}}{1 + sT_{H2}} \quad (3)$$

wherein $T_{L1}$, $T_{L2}$, $T_{H1}$ and $T_{H2}$ are constants which are determined by the particular circuit constructions and characteristics of filters 4 and 2.

Let it be assumed that the information signal supplied to input terminal 1 is represented by x. Let it be further assumed that the output signal produced by circuit 100 and provided at output terminal 6 is represented by y, and that the amplified signal produced at the output of voltage controlled amplifier 32 is represented by Z. Now, if that portion of signal Z which is fed back to subtracting circuit 31 by feedback resistor 33 is represented as N, then the output of voltage controlled amplifier 32 may be represented as:

$$G(x \cdot F_H - Z \cdot N) = Z \quad (4)$$

$$GxF_H - GNZ = Z \quad (5)$$

By rearranging terms, equation (5) may be rewritten as:

$$Z(1 + GN) = GF_H x \quad (6)$$

Now, the output Z from voltage controlled amplifier 32 may be expressed as:

$$Z = \frac{F_H \cdot G}{1 + GN} \cdot x \quad (7)$$

The output y produced by summing circuit 5 is equal to the sum of the output of low pass filter 4 and output Z, assuming that output Z does not exceed the predetermined limit level of limiting circuit 34. Hence, output y supplied to output terminal 6 may be represented as:

$$y = Z + F_L \cdot x \quad (8)$$

$$y = \frac{F_H \cdot G}{1 + GN} \cdot x + F_L \cdot x \quad (9)$$

$$y = \frac{F_L + G(F_H + F_L N)}{1 + GN} x \quad (10)$$

As mentioned above, weighting circuit 71 exhibits high pass filter characteristics which are substantially similar to the high pass filter characteristics of high pass filter 2. These filter characteristics may be represented as transfer function $F_H$. Since rectifying and smoothing circuit 72 performs a rectifying operation to produce gain control voltage $v_c$, this gain control voltage may be represented as:

$$v_c = |y \cdot F_H| \quad (11)$$

When equation (11) is substituted into equation (1), the gain G of voltage controlled amplifier 32 is represented as:

$$G = K / |y \cdot F_H| \quad (12)$$

Now, if equation (12) is substituted into equation (10), the level-compressed output signal y produced at output terminal 6 may be represented as:

$$y = \frac{F_L + \frac{K}{|y \cdot F_H|} \cdot (F_H + F_L N)}{1 + \frac{K}{|y \cdot F_H|} \cdot N} \cdot x \quad (13)$$

Calculations based upon equation (13) result in curves which are substantially similar to the frequency-dependent level-compression characteristics shown in FIG. 5.

Figure 7:
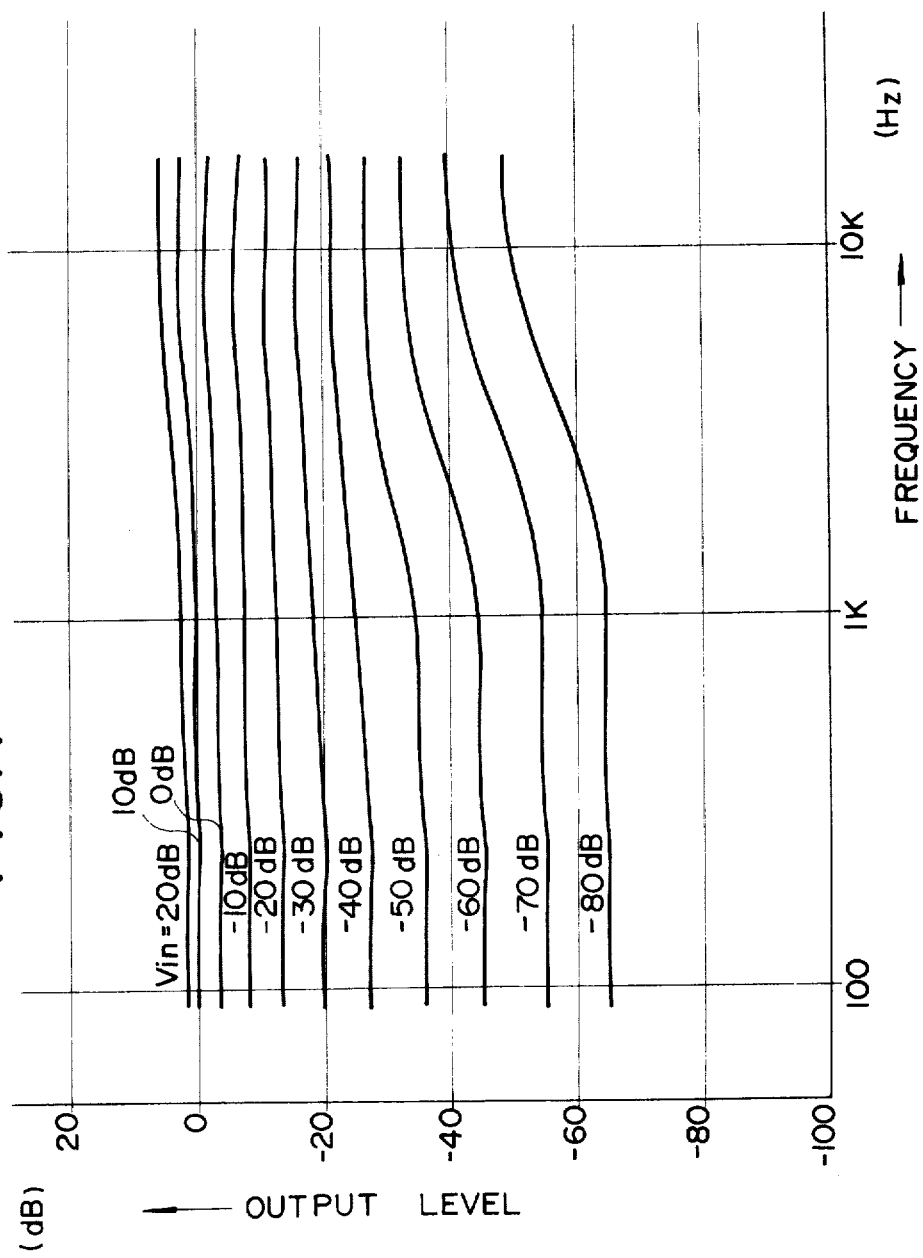
FIG. 7 is a graphical representation of the operation of the variable gain amplifier used with the present invention.

In the foregoing description, output Z has been referred to as the output produced by voltage controlled amplifier 32. It is appreciated that this output Z also is produced at the output of variable gain amplifier 3 in the embodiment shown in FIG. 3. This output Z exhibits frequency-dependent characteristics of the type illustrated in FIG. 7. Each curve in FIG. 7 represents a respective input signal level, and output Z, produced at the output of variable gain amplifier 3, is seen to increase as the frequency of the input signal increases, provided that the input signal level is relatively low. As the input signal level increases, the gain of variable gain amplifier 3 decreases, thereby increasing the compression ratio. Consequently, limiting circuit 34 may be provided at the output of the variable gain amplifier without adversely affecting the operation of circuit 10 or circuit 100.

Figure 8:
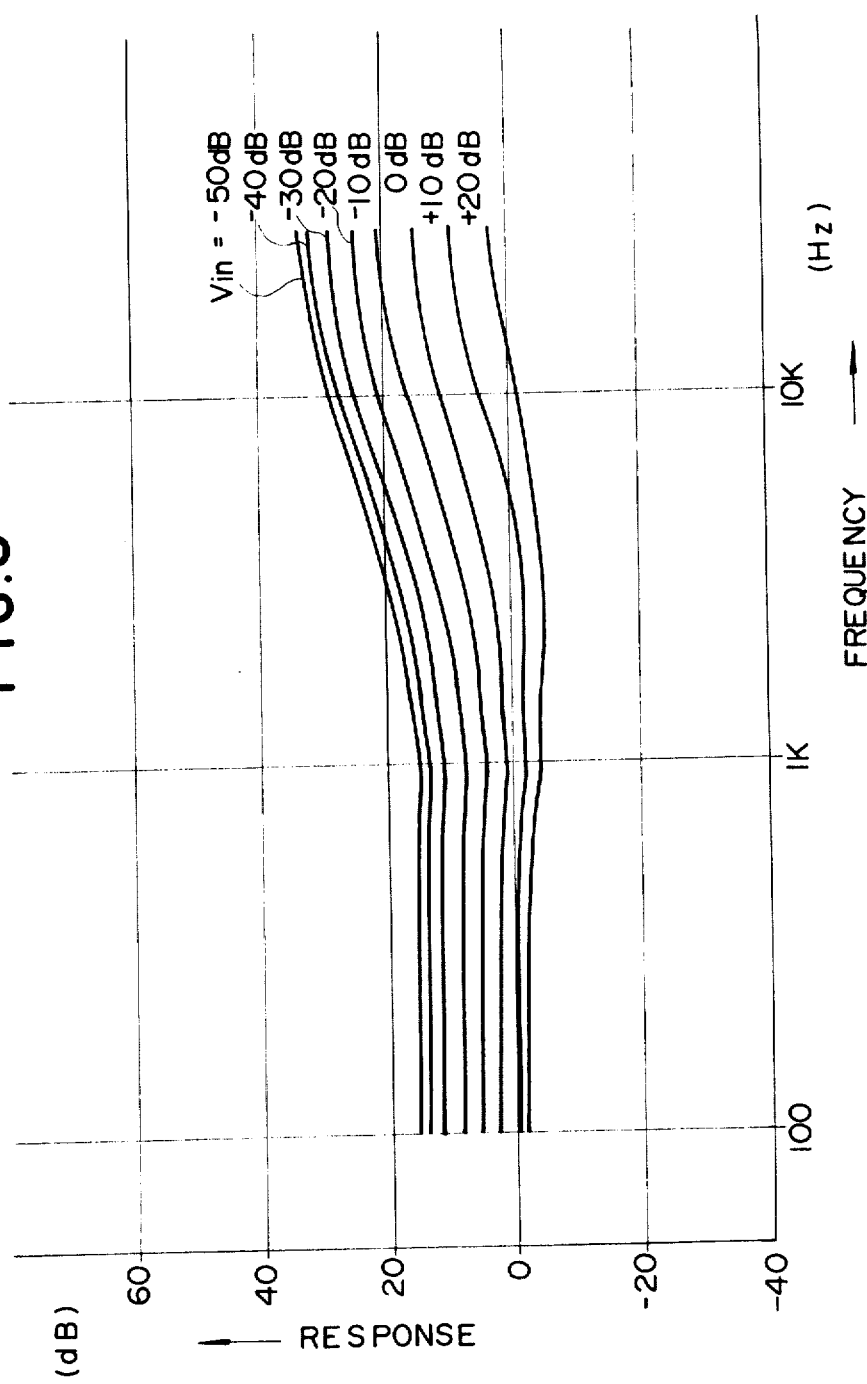
FIGS. 8 and 9 are graphical representations of the level-compression characteristics of the FIG. 4 embodiment for particular input signals.

The graphical illustrations of FIGS. 5–7 represent individual, single input signals supplied to input terminal 1. Referring now to FIG. 8, the level-compression operation of noise reduction circuit 100 is graphically depicted in response to two separate signals: a first signal of 400 Hz whose level changes from +20 dB to −70 dB, and a second signal whose input level is constant at −100 dB, but whose frequency changes from 100 Hz to 25 KHz. A comparison of FIGS. 5 and 8 illustrates that the low level signal (−100 dB) of higher frequency affects the overall level-compression characteristics of circuit 100, even if the lower frequency signal (400 Hz) is at a high level (+20 dB).

Figure 9:
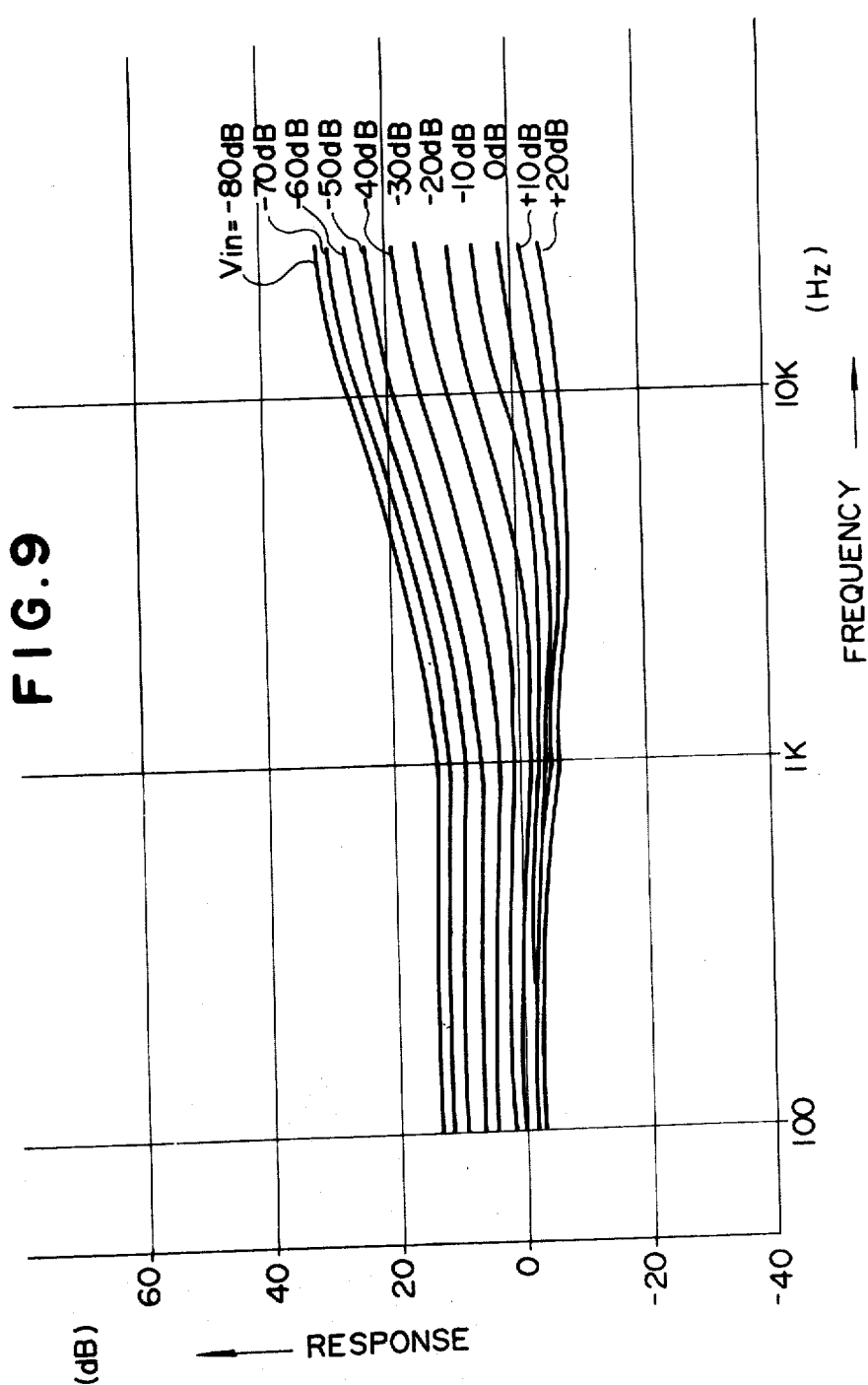

FIG. 9 represents the level-compression characteristics of FIG. 4 in response to two input signals: a first input signal at a constant frequency of 10 KHz whose level changes from +20 dB to −70 dB, and a second signal of constant level −100 dB whose frequency changes from 100 Hz to 25 KHz. The curves shown in FIG. 9 more closely resemble those of FIG. 8 than FIG. 5.

It will be seen from the foregoing that the noise reduction circuit in accordance with the present invention provides variable pre-emphasis. That is, different pre-emphasis curves are obtained for different levels of the input signal. Because of this variable pre-emphasis, substantially higher pre-emphasis is provided over a high frequency range when the input signal level is relatively low; whereas a substantially flat pre-emphasis characteristic is obtained when the input signal level is relatively high. This is preferred because, if the input signal level is relatively high, it may be recorded on a magnetic medium without the need of any pre-emphasis thereon.

The invention described in the foregoing embodiments is of relatively simple construction and, thus, is inexpensive. Nevertheless, this invention permits variable pre-emphasis to be obtained, as described above, without requiring any external or manual adjustment. By providing large pre-emphasis over a high frequency range when the input signal level is low, the aforementioned phenomenon of noise modulation is substantially reduced and, in many cases, may be effectively eliminated. Furthermore, the present invention readily enables a limiting circuit, such as limiting circuit 34, to be used so as to prevent transient saturation of the magnetic recording medium due to overshoot caused by an abrupt, or sudden increase in signal level which, heretofore, could not be compensated quickly enough.

A schematic diagram of the embodiment shown in FIG. 4 now will be described with reference to the illustration thereof set out in FIG. 10. Like component parts are identified by the same reference numerals as were used in FIG. 4. High pass filter 2, included in the first signal path coupled to input terminal 1, is comprised of the RC circuit formed of resistor 21 connected in series with capacitor 22. This series circuit is connected in parallel with a resistor 23, and this combination is coupled to the input of an amplifier 35, the latter being included in variable gain amplifier 3.

Preferably, amplifier 35 is an operational amplifier exhibiting high negative gain. Feedback resistor 33, shown in FIG. 4, also is shown in FIG. 10 as being interconnected between the output and input of amplifier 35.

It is appreciated by those of ordinary skill in the art that the gain of an amplifier circuit formed of an operational amplifier is a function of the feedback impedance, that is, the impedance connected between the output and input of the operational amplifier, divided by the input impedance, that is, the impedance connected to the input thereof. The gain of the amplifier circuit thus may be adjusted by varying either the feedback impedance or the input impedance. In the embodiment shown in FIG. 10, a feedback resistance 36, connected in parallel with feedback resistor 33, is adjustable in response to a control signal supplied thereto so as to vary the gain of variable gain amplifier 3. As the resistance value of adjustable resistance 36 increases, the gain of the variable gain amplifier correspondingly increases. Conversely, as the resistance value of this adjustable resistance decreases, the gain of the operational amplifier also decreases. As one example thereof, adjustable resistance 36 may be, for example, a photo-responsive component, such as a CdS photoconductive cell, a photoresistor, or the like, exhibiting an impedance, or resistance, that is variable as a function of the intensity of light impingent thereon. For example, the photo-responsive element may be light coupled to a light emitting diode, or other light-emitting source, capable of transmitting light to the photo-responsive element as a function of a control voltage supplied thereto. This control voltage is produced by control circuit 7 comprised of weighting circuit 71 and rectifying and smoothing circuit 72. As the control voltage increases, the intensity of the light emitted by the light emitting element likewise increases so as to reduce the resistance or impedance of the light-responsive element, thereby reducing the gain of variable gain amplifier 3. Conversely, as the control voltage decreases, the intensity of the light emitted by the light emitting element likewise decreases so as to increase the impedance of the light-responsive element, thereby increasing the gain of variable gain amplifier 3.

As an alternative to the aforementioned photo-responsive element, adjustable resistance 36 may be comprised of a field effect transistor (FET), bipolar transistor, or the like, whose impedance is controllable in response to the control voltage supplied thereto by control circuit 7. Thus, as the impedance of the FET or transistor varies, the gain of variable gain amplifier 3 likewise varies.

In the embodiment shown in FIG. 4, limiting circuit 34 is illustrated as being connected in series between the output of variable gain amplifier 3 and an input of summing circuit 5. In FIG. 10, limiting circuit 34 is illustrated as being comprised of a pair of parallel-connected, oppositely-poled diode circuits connected in the feedback circuit of operational amplifier 35. In this example, each diode circuit is formed of two diodes in series. This diode-type limiter circuit is connected in series with an additional resistor. It is appreciated that, if the difference between the output and input signals of amplifier 35 is less than the effective diode breakdown voltage (if the diode breakdown voltage is assumed to be $V_{be}$, then the effective diode breakdown voltage for the illustrated example is $2V_{be}$, wherein $V_{be}=0.7$ for silicon diodes), then the resistor connected to this diodetype limiter is disconnected from the amplifier feedback circuit. However, once this difference exceeds the diode breakdown voltage, the illustrated resistor is connected in the amplifier feedback circuit and, thus, is disposed in parallel with adjustable resistance 36 and feedback resistor 33, thereby reducing the effective feedback resistance so as to reduce the gain of the amplifier. Consequently, transient overshoots are reduced.

The output of amplifier 35 is coupled to summing circuit 5 via a resistor 51. The summing circuit includes another resistor 52 which couples the output of low pass filter 4 to the summing circuit. The low pass filter is comprised of an active filter including input resistors 41 and 43 connected in series, the junction therebetween being coupled to ground via a capacitor 44. An amplifier 42 which, for example, may be an operational amplifier, preferably has negative gain, and the input thereof is coupled to resistor 43. A feedback resistor is connected between the output and input of this amplifier. Amplifier 42 provides phase matching of the signal passed by low pass filter 4 with the signal transmitted through variable gain amplifier 3. The output of the low pass filter, and more particularly, the output of amplifier 42, is coupled to resistor 52 of summing circuit 5.

The summing circuit is comprised of summing resistors 51 and 52 connected to the input of an amplifier 53. Preferably, amplifier 53 exhibits negative gain and may be an operational amplifier having a feedback resistor, as illustrated. The output of this summing circuit, that is, the output of amplifier 53, is coupled to output terminal 6.

Control circuit 7, which is coupled to output terminal 6 and which is comprised of weighting circuit 71 and rectifying and smoothing circuit 72 produces the aforementioned control voltage which is used to adjust the resistance of adjustable resistance 36 and thereby adjust the gain of variable gain amplifier 3. Weighting circuit 71 is comprised of a high pass filter formed of series-connected resistor 73 and capacitor 74 coupled in parallel with series-connected resistor 75 and capacitor 76. The output of these parallel-coupled RC circuits is connected to an amplifier 77 which, preferably, is an operational amplifier exhibiting negative gain and having a feedback resistor, as illustrated. It will be appreciated that weighting circuit 71 exhibits a high pass filter characteristic that is similar to the high pass filter characteristic of high pass filter 2. The output of amplifier 77 is coupled to rectifying and smoothing circuit 72, the latter being comprised of, for example, a diode coupled to a capacitive filter. Rectifying and smoothing circuit 72 produces a DC control signal that is a function of the level of the higher frequency components passed by weighting circuit 71.

Thus, as the level of the input signal increases, the gain of amplifier 35 decreases so as to reduce the pre-emphasis of the higher frequency components included in the input signal. The level-compression characteristics illustrated in FIG. 5 thus are obtained by the circuit schematically illustrated in FIG. 10.

Figure 11:
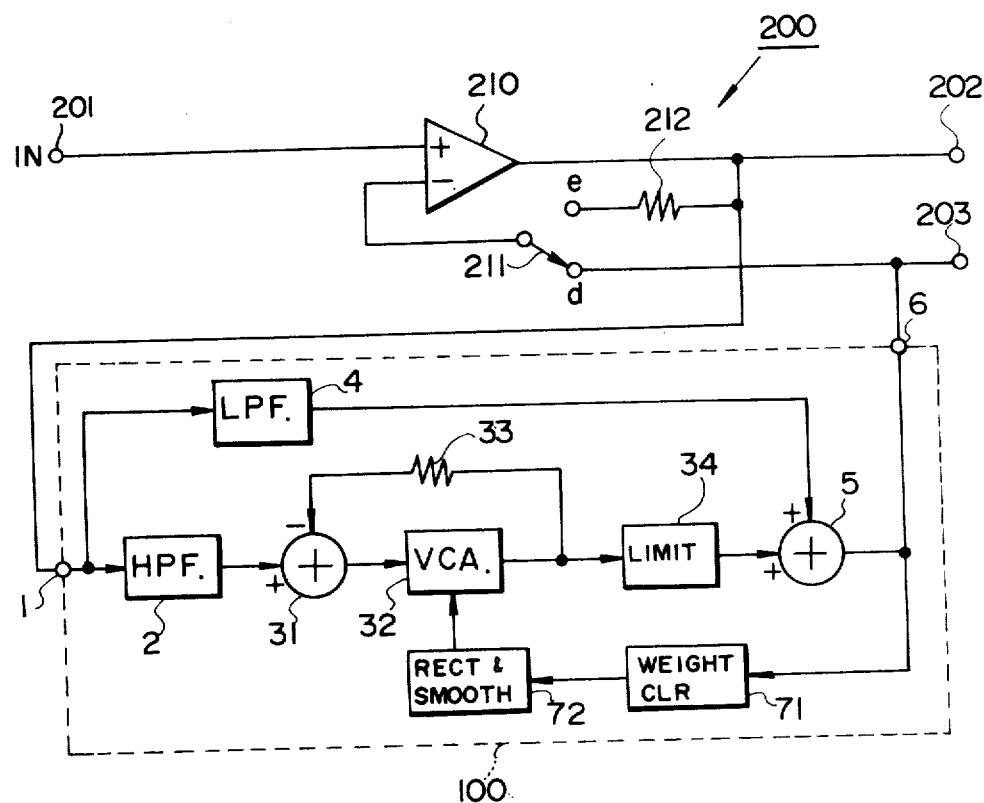
FIG. 11 is a block diagram showing the use of the FIG. 4 embodiment as an encoder or decoder in a noise reduction system.

In the embodiments of the present invention thus far described, the noise reduction circuit is used as a level-compression circuit in an encoder for information signals which are to be magnetically recorded. A level expansion circuit in a decoder should be provided with level-expansion characteristics which are complementary to the characteristics shown in FIG. 5 in order to return a signal reproduced from the magnetic medium back to its original form. The noise reduction circuit of FIG. 4 can be used in such a decoder, as illustrated in FIG. 11. More particularly, noise reduction circuit 100 is connected in the negative feedback path of an operational amplifier 210, this operational amplifier having a non-inverting input coupled to an input terminal 201 to receive the reproduced information signal, and an inverting input coupled to output terminal 6 of circuit 100. The output of amplifier 210 is coupled to input terminal 1 of noise reduction circuit 100. Thus, the noise reduction circuit is connected as a negative feedback circuit; and the output of the illustrated decoder is derived from an output terminal 202 which is coupled to the output of amplifier 210.

Desirably, noise reduction circuit 100 is selectively disposed for operation either as an encoder or a decoder. To this effect, amplifier 210 is provided with a switching element 211, schematically illustrated as a mechanical switch, having two switching conditions. When switch 211 engages contact d, noise reduction circuit 100 is connected as a negative feedback circuit from the output to the inverting input of amplifier 210, as described above. When switch 211 is connected to contact e, a feedback resistor 212 is connected between the output and inverting input of amplifier 210, thus establishing the gain of the amplifier, and the output of amplifier 210 is further connected to supply amplified information signals to noise reduction circuit 100. Thus, when switch 211 is connected to contact d, the illustrated circuit 200 functions as a decoder to produce level-expanded information signals at output terminal 202. However, when switch 211 is coupled to contact e, circuit 200 functions as an encoder to produce level-compressed signals at output terminal 6. As illustrated, output terminal 6 is coupled to another output terminal 203 which, in turn, may be coupled to a magnetic recording transducer.

It is appreciated that, by using noise reduction circuit 100 in two switchable modes, the same circuit can be used as an encoder and as a decoder, thus providing desirable conservation of parts. In typical recording/reproducer apparatus, such as in an audio tape recorder, information signals are not recorded and reproduced concurrently. Thus, rather than providing separate encoding and decoding circuitry, it is advantageous to utilize the same noise reduction circuit 100 for the separately performed encoding and decoding operations. Moreover, by using the same noise reduction circuit in both modes of operation, there is no difficulty in matching the characteristics of the encoder and decoder.

The characteristics of noise reduction circuit 100 have been described in detail hereinabove and, in the interest of brevity, this description is not repeated. It is appreciated, therefore, that when switch 211 engages fixed contact e, circuit 200 operates in substantially the same manner as discussed in detail hereinabove with respect to the embodiments of FIGS. 4 and 10. That is, the input information signal is amplified by amplifier 210 and suitably level-compressed, with variable pre-emphasis, by circuit 100.

When switch 211 engages contact d, the transfer characteristics of circuit 100 are used as the negative feedback gain B of circuit 200. If the open-loop gain of amplifier 210 is represented as A, then the overall gain, or transfer characteristic, of circuit 200 is equal to $A/(1+AB)$. This, of course, is the gain of an amplifier having negative feedback. Now, if the open-loop gain A of amplifier 210 is sufficiently large, that is, $A >> 1$, then the gain, or transfer characteristic, of circuit 200, when disposed in its decoding configuration, merely is equal to $1/B$. Thus, when circuit 100 is connected as a negative feedback circuit to amplifier 210, the overall characteristics of circuit 200 are converse, or complementary to, the encoder transfer characteristic B. Hence, it is appreciated that, when circuit 100 is used as a decoder, the level-compressed, pre-emphasized signal which now is reproduced from the record medium is returned to its original form.

While the present invention has been particularly shown and described with reference to certain preferred embodiments, it should be readily apparent to those of ordinary skill in the art that various changes and modifications in form and details may be made without departing from the spirit and scope of the invention. It is intended that the appended claims be interpreted as including all such changes and modifications.

What is claimed is:

1. A circuit for noise reduction, wherein higher frequency signal components are subjected to greater gain than lower frequency signal components at lower level input signals, comprising means for supplying an input signal; a first signal path having variable gain coupled to said means for supplying and including high pass filter means for providing substantial de-emphasis of the lower frequency components of said input signal relative to the higher frequency components thereof, and variable gain amplifier means having a controllable gain coupled to said high pass filter means for amplifying the output of said high pass filter means; a second signal path having fixed gain coupled to said means for supplying an input signal for providing, at most, relatively minor de-emphasis of the higher frequency components of said input signal relative to the lower frequency components thereof; summing means for summing the outputs of said first and second signal paths to produce an output signal; and means for controlling the gain of said variable gain amplifier means in response to the level of said output signal, whereby said variable gain amplifier means has higher gain when the input signal level is relatively low and lower gain when said input signal level is relatively high.

2. The circuit of claim 1 wherein said second signal path includes a low pass filter.

3. The circuit of claim 1 wherein said second signal path includes attenuating means for providing de-emphasis of both the lower and higher frequency components of said input signal.

4. The circuit of claim 1 wherein said first signal path further includes limiting means for limiting transient overshoot in the event of a sudden increase in the input signal level.

5. The circuit of claim 4 wherein said limiting means is connected in series with the output of said variable gain amplifier means.

6. The circuit of claim 4 wherein said variable gain amplifier means comprises an amplifier having a negative feedback circuit, and said limiting means comprises diode limiter means connected in said negative feedback circuit.

7. The circuit of claim 1 wherein said means for controlling the gain of said variable gain amplifier means in response to the level of said output signal comprises weighting circuit means coupled to said summing means for deriving a gain control signal from the higher frequency components of the said output signal; and means for applying said gain control signal to said variable gain amplifier means such that the gain of the latter is inversely related to the level of said gain control signal.

8. The circuit of claim 7 wherein said variable gain amplifier means comprises a voltage-controlled amplifier; and said means for applying said gain control signal comprises rectifying means for producing a gain control voltage as a function of said gain control signal.

9. The circuit of claim 7 wherein said weighting circuit means comprises high pass filter means.

10. The circuit of claim 9 wherein the respective high pass filter means have substantially similar filtering characteristics.

11. The circuit of claim 1 wherein said variable gain amplifier means comprises a voltage-controlled amplifier, feedback means for feeding back a predetermined proportion of the output of said voltage-controlled amplifier, and means for subtracting the fed back proportion of said output of said voltage-controlled amplifier from the output of said high pass filter means to supply a difference signal to said voltage-controlled amplifier.

12. A level compression circuit having a transfer characteristic that is more frequency-sensitive for lower level input signals than for higher level input signals, such that higher frequency components are subjected to greater gain at lower level input signals, said circuit comprising a first signal path connected to receive said input signal and including high pass filter means for emphasizing higher frequency components relative to lower frequency components of said input signal, and variable gain amplifier means having a controllable gain for amplifying the output of said high pass filter means; a second signal path connected to receive said input signal for providing, at most, relatively little emphasis of the lower frequency components relative to the higher frequency components of said input signal; summing means for summing the outputs of said first and second signal paths to produce a level-compressed output signal; and control means for controlling the gain of said variable gain amplifier means in response to the level of said level-compressed output signal such that said gain decreases as the input signal level increases.

13. The circuit of claim 12 wherein said first signal path further includes limiting means for limiting transient overshoot in the signal amplified by said variable gain amplifier means in the event of a sudden increase in said input signal level.

14. The circuit of claim 13 wherein said control means for controlling the gain of said variable gain amplifier means in response to the level of said level-compressed output signal comprises high pass filter means for filtering said level-compressed output signal, and smoothing means for smoothing the filtered, level-compressed output signal to produce a gain-control signal, said gain-control signal being applied to said variable gain amplifier means.

15. A level expansion circuit having a transfer characteristic that is more frequency-sensitive for lower level input signals than for higher level input signals, such that the higher frequency components are subjected to greater level-adjustment at lower level input signals, said circuit comprising an amplifier for receiving said input signal, and having an output terminal for providing a level-expanded signal; and a negative feedback circuit coupled to said output terminal and including:
 a first circuit path connected to receive the output of said amplifier and including high pass filter means for emphasizing higher frequency components relative to lower frequency components of said amplifier output, and variable gain amplifier means having a controllable gain for amplifying the output of said high pass filter means; a second signal path connected to receive said amplifier output for providing, at most, relatively little emphasis of the lower frequency components relative to the higher frequency components of said amplifier output; summing means for summing the outputs of said first and second signal paths to produce an output signal; and control means for controlling the gain of said variable gain amplifier means in response to the level of said output signal, such that said gain decreases as the input signal level increases.

16. The circuit of claim 15 wherein said second signal path includes low pass filter means.

17. The circuit of claim 16 wherein said first signal path further includes limiting means for limiting transient overshoot in the signal amplified by said variable gain amplifier means in the event of a sudden increase in the input signal level.

18. The circuit of claim 17 wherein said control means comprises a weighting circuit coupled to the output of said summing means; and rectifying and smoothing means coupled to said weighting circuit for supplying a gain control signal to said variable gain amplifier means as a function of the higher frequency components in the output of said summing means.

19. A level compression/expansion circuit for noise reduction, comprising an amplifier for receiving an input signal; an input terminal coupled to the output of said amplifier; a first circuit path coupled to said input terminal and including high pass filter means for emphasizing higher frequency components relative to lower frequency components of the amplifier output, and variable gain amplifier means having controllable gain for amplifying the output of said high pass filter means; a second signal path coupled to said input terminal for providing relatively little emphasis of the lower frequency components relative to the high frequency components of said amplifier output; summing means for summing the outputs of said first and second signal paths and producing an output signal therefrom; control means for controlling the gain of said variable gain amplifier means in response to said summing means output signal, such that said gain is in inverse relationship to the input signal level; and switch means having a first condition whereby the level compression/expansion circuit functions as a level compression circuit to produce a level-compressed signal at the output of said summing means, and having a second condition whereby the output of said summing means is fed back to said amplifier in negative feedback relationship such that said level compression/expansion circuit functions as a level expansion circuit to produce a level-expanded signal at said amplifier output.

* * * * *